United States Patent [19]

Scheuerlein

[11] E Patent Number: Re. 32,236

[45] Reissued Date of Patent: Aug. 26, 1986

[54] ONE DEVICE FIELD EFFECT TRANSISTOR (FET) AC STABLE RANDOM ACCESS MEMORY (RAM) ARRAY

[75] Inventor: Roy E. Scheuerlein, Sunnyvale, Calif.

[73] Assignee: International Business Machines Corporation, Armonk, N.Y.

[21] Appl. No.: 763,171

[22] Filed: Aug. 7, 1985

Related U.S. Patent Documents

Reissue of:

[64] Patent No.: 4,319,342
Issued: Mar. 9, 1982
Appl. No.: 106,641
Filed: Dec. 26, 1979

[51] Int. Cl. ..... G11C 11/24; G11C 11/40; G11C 5/10

[52] U.S. Cl. ..... 365/149; 365/72; 357/45

[58] Field of Search ..... 365/72, 149, 182; 357/41, 45, 59

[56] References Cited

U.S. PATENT DOCUMENTS

| | | | |
|---|---|---|---|
| 3,387,286 | 6/1968 | Dennard | 365/149 |
| 4,044,340 | 8/1977 | Itoh | 365/149 |
| 4,103,347 | 7/1978 | Barton | 365/183 |
| 4,219,834 | 8/1980 | Esch et al. | 357/41 |

FOREIGN PATENT DOCUMENTS

| | | |
|---|---|---|
| 50-155665 | 7/1977 | Japan . |
| 52-65375 | 1/1979 | Japan . |
| 2005077 | 4/1979 | United Kingdom . |

OTHER PUBLICATIONS

Itoh et al., "A High-Speed 16 K Bit HMOS Random Access Memory", IEEE J. Solid-State Circuits, SC-11, pp. 585-590, Oct. 1976.

*Primary Examiner*—Joseph A. Popek
*Attorney, Agent, or Firm*—Robert J. Haase

[57] ABSTRACT

Disclosed is an integrated circuit electrode memory array having a plurality of FET memory cells arranged in rows and columns and formed on the same integrated circuit chip with associated support circuits. Each memory cell of the array has a capacitive storage region, an adjacent channel region, and a gate region for controlling the transfer of binary information through the channel region in and out of the capacitive storage region. Each memory cell also has a bit line contact region which is shared with an adjacent memory cell. The word lines are arranged in rows in a substantially equidistant parallel relationship, each word line passing, in succession, over the storage region of a first one of the memory cells and electrically integral with the gate region of a second one of the memory cells. The column arrangement of memory cells is interdigitated such that the memory cells associated with a single bit line are arranged in first and second parallel lines along both the left and right sides of each bit line. Thus, the bit line is arranged in a zig-zag configuration alternatively contacting memory cells arranged along its left and right side.

29 Claims, 7 Drawing Figures

ONE DEVICE FIELD EFFECT TRANSISTOR (FET) AC STABLE RANDOM ACCESS MEMORY (RAM) ARRAY

Matter enclosed in heavy brackets [ ] appears in the original patent but forms no part of this reissue specification; matter printed in italics indicates the additions made by reissue.

TECHNICAL FIELD

This invention relates to an integrated circuit electronic memory array having a plurality of memory cells, and more particularly to a dense arrangement of one device FET memory cells in which both the word and bit line conductors are positioned above the semiconductor substrate surface.

It is a primary object of the present invention to provide a memory array that substantially doubles the number of memory cells that can be arranged along a bit line of predetermined length.

Another object of this invention is to improve the transfer ratio (storage capacitance/bit line capacitance) in a densely packed FET memory array.

A still further object of this invention is to fabricate an improved memory array in which bit line spacing is not limited by sense amplifier space requirements.

Lastly, it is an object of this invention to fabricate a memory array having a continuous plane for the storage plate electrodes in the capacitor storage region of a one device FET memory cell.

BACKGROUND ART

Integrated circuit electronic memory arrays having a plurality of one device FET memory cells are notoriously well known in the art. Such an array of memory cells was first proposed in Dennard U.S. Pat. No. 3,387,286 entitled: "Field-Effect Transistor Memory". Subsequently, various improvements were made primarily in the fabrication process in integrated semiconductor circuit technology.

One such semiconductor integrated circuit process is the self-aligned silicon gate process. In this FET process, silicon gate regions (usually polysilicon) are formed prior to the formation of doped source and drain regions. Source and drain regions are known to be formed by both diffusion and ion implantation processes and are self-aligned to the gate region by virtue of the fact that the gate is utilized as the mask. This silicon gate technology, which is a polysilicon process, has been extended to several layers of polysilicon conductors such as double polysilicon (DPS) and triple polysilicon (TPS) etc.

In this technology, it is common practice for the bit line to be an elongated doped N+ region; which same region also forms the drain or source region of the one device FET memory cell. Drain and source regions are interchangeable in FETs and depend on the applied bias voltages. The bit line is electrically integral with (e.g. connected to) the doped region farthest from the capacitor. The distributed capacitance along the length of such a doped bit line is relatively high. Since the signal strength at the sense amplifier input (connected to the bit line) is a function of the transfer ratio (memory cell capacitance/bit line capacitance), a large bit line capacitance tends to reduce the useful input signal to the sense amplifier. To improve the transfer ratio, the size of the storage capacitor in the memory cell can be increased.

The added space occupied by such a storage capacitor is undesirable because it reduces the number of memory cells that can be put on a semiconductor chip of a given size. Moreover, the doped bit line also has a finite resistance which together with the various capacitances including the storage capacitor affect the rise time of pulses being transferred in and out of the storage capacitor. Thus, a larger storage capacitor could result in a slower operating memory cell.

It becomes apparent that a conductive bit line formed above the silicon substrate surface from a metal such as aluminum, for example, would have a substantially reduced resistance in comparison with a doped bit line. More importantly, the dielectric insulation between such an aluminum bit line and other conductive lines and circuit elements results in a substantially reduced bit line capacitance with a corresponding substantial improvement in the transfer ratio.

For this reason, the prior art has addressed the concept of memory arrays utilizing metal bit lines. For example, see Kiyoo Itoh et al., "A High-Speed 16 K Bit NMOS Random Access Memory", IEEE J. Solid-State Circuits SC-11, pp. 585–590, October 1976. Although this article describes a device with the advantages of metal bit lines, it is accompanied by a number of disadvantages in semiconductor integrated circuit fabrication. For example, it results in bit lines that are excessively long for the number of bits along such a bit line. In addition to being wasteful of space, there occurs an excessive capacitance between the bit line and the polysilicon from which it is insulated by a dielectric such as silicon dioxide. A very significant disadvantage of such a prior art metal bit line configuration is that the bit line pitch (width of one bit line) is too small to properly fit a sense amplifier at the end of the bit line. Thus, the spacing between bit lines must be increased in order to properly accommodate sense amplifiers, further decreasing the packing density of the array.

BRIEF DESCRIPTION OF DRAWINGS

In the accompanying drawings forming a material part of this disclosure.

DISCLOSURE OF INVENTION

For further comprehension of the invention and the objects and advantages thereof, reference will be had to the following description and the accompanying drawings and to the appended claims in which the various novel features of the invention are more particularly set forth.

Figure 1:
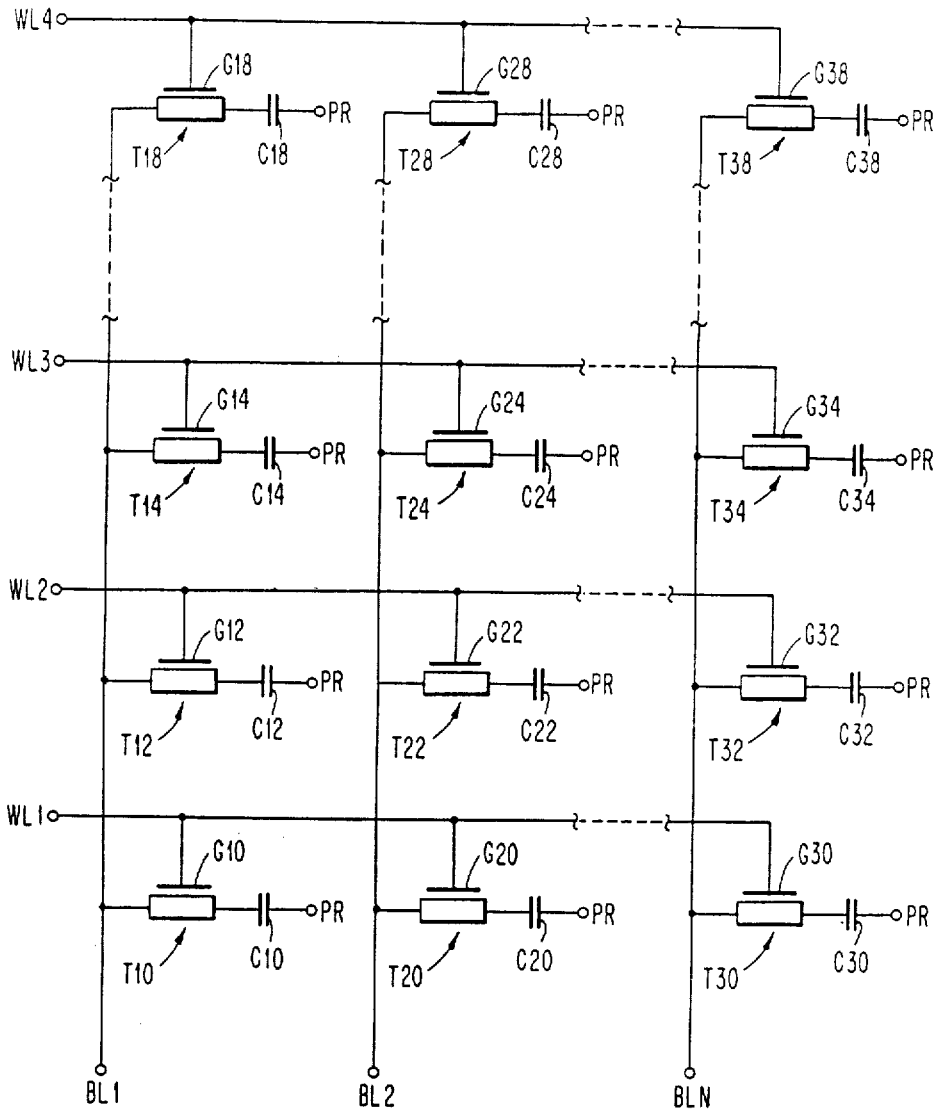
FIG. 1 is a circuit diagram illustrating a memory array of one device FET memory cells.

FIG. 1 is a circuit diagram schematically illustrating a portion of a memory array. Twelve memory cells are shown in this illustration. Actually, semiconductor chips having sixteen-thousand and even sixty-four-thousand memory cells on a single semiconductor chip are commercially available. With the present invention and other contemplated improvements in the art, a single semiconductor chip measuring approximately one fourth of an inch on each side will soon hold two-hundred and fifty-six thousand memory cells (or more) together with all the support circuits associated with memory arrays. Such support circuits typically include clock generators, address buffers, decoders, sense amplifiers, latches, etc.

With continued reference to FIG. 1, a column of such memory cells is typically connected to a single bit line such as BL1. The cell has an FET T10 connected to a capacitor C10. The bit line is connected to doped region N1 (source or drain of the FET). One plate of capacitor C10 is also connected to the FET. The other plate of the capacitor C10 (as well as all the other capacitors in the array) is connected to a plate region PR. Bit line BL1 is also connected to transistors T12, T14, and T18. T12 forms a memory cell in conjunction with capacitor C12, T14 with capacitor C14 and T18 with capacitor C18. Transistors T12 and T14 share a common bit line contact and doped region N2 as will become clearer herein below. Similarly, T10 would share a common doped region N1 with the next preceeding transistor in the array (not shown) while T18 would share a common doped region with the next succeeding memory cell along bit line 1 (also not shown).

Additional bit lines such as BL2 through BLN are similarly arranged. Thus, the memory cells illustrated along BL2 are in sequence: T20, C20,; T22, C22; T24, C24; and T28, C28. With respect bit line N (BLN) the memory cells in sequence are: T30, C30; T32, C32; T34, C34; and T38, C38. Broken lines have been used to indicate the existence of a large number of similar bit lines and word lines. In all of the foregoing, as previously mentioned, one plate of every capacitor is connected to a plate region PR.

In addition to the bits and bit lines arranged in columns, each memory cell is also contacted electrically by one of the word lines arranged in rows. Thus, word line 1 (WL1) contacts the gate region G10 of FET T10 and also the gate region G20 of transistors T20, gate G30 of T30, and others along the row (not shown). In the same way, WL2 contacts gate G12 of transistor T12, gate G22 of transistor T22 and gate G32 of transistor T32 etc. Similarly, word line WL3 contacts gate G14 of transistor T14, gate G24 of transistor T24 as well as gate G34 of T34. Lastly, word WL4 contacts gate G18 of transistor T18, gate G28 of transistor T28 and gate G38 of transistor T38. Those skilled in the art will recognize that in integrated circuit form, each word line can be fabricated electrically integral with the gate region of every transistor along that word line. The circuit functional effect is that the word line contacts the gate of the memory cell.

Figure 2:
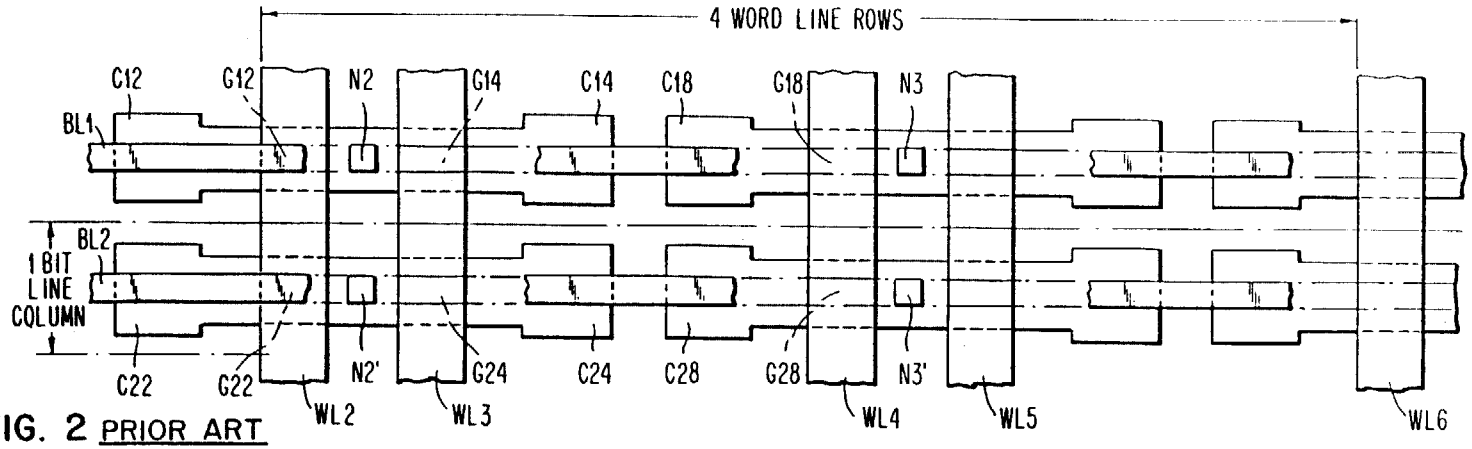
FIG. 2 PRIOR ART
FIG. 2 is a schematic top view of a prior art memory array.

An array of the type illustrated in FIG. 1 can be fabricated in integrated circuit form in accordance with the prior art illustrated in FIG. 2. Corresponding elements have been labeled with corresponding reference numerals insofar as practical. Bit line 1 from left to right passes first over capacitor C12, then over word line 2 (which in turn covers gate G12) and then contacts doped region N2 forming a bit line contact region. Doped Region N2 is shared by the next memory cell along the bit line including transistor T14 and capacitor C14. Thus, in sequence the bit line next passes over word line 3 (which in turn covers gate 14) and then over capacitor C14. The pattern then becomes repetitive as bit line 1 then passes over capacitor C18, over word line 4, and contacts doped region N3 at the bit line contact region for T18, C18, and the next adjacent memory cell. Similarly, bit line 2 follows an identical path from left to right as can be seen by correlating the FIG. 2 and FIG. 1 drawings.

With continued reference to FIG. 2, the word lines WL2, WL3, WL4, WL5 and WL6 run parallel to each other and orthogonally with respect to the bit lines. WL2 contacts gate regions G12 and G22 permitting binary information transfer (charge transfer) between capacitor C12 and doped region N2 and capacitor C22 and doped region N2', respectively. Similarly, WL3 contacts gate regions G14 and G24; WL4 contacts gate regions G18 and G28 while WL5 and WL6 contact their respective gate regions over which they pass (not specifically labeled).

A number of problems are noted with respect to the FIG. 2 arrangement. First, the amount of space required between the left edge of word line 2 and the left edge of word line 6 is excessive. Not only does this use excessive semiconductor real estate but it also unduly lengthens the bit lines thereby increasing the capacitance associated with them. On the other hand, the amount of space required for one bit line is quite small. Unfortunately, this also turns out to be a disadvantage. Specifically, the bit lines are bit/sense lines used for writing data into and reading data out from those memory cells of an array which have their gate electrodes activated by a word line. Thus, the write/read circuitry is advantageously positioned at the end of each bit line. More specifically, the sense amplifiers used to detect very small variations in voltages on the bit lines, are positioned as close to the end of each bit line as possible. This associated sense circuitry typically requires more space than the illustrated one bit line width in FIG. 2, thereby requiring a wide spacing between bit lines such as bit line 1 and bit line 2 in order to accommodate the sense circuitry. This results in additional wasted semiconductor space not specifically illustrated in FIG. 2.

Figure 3:
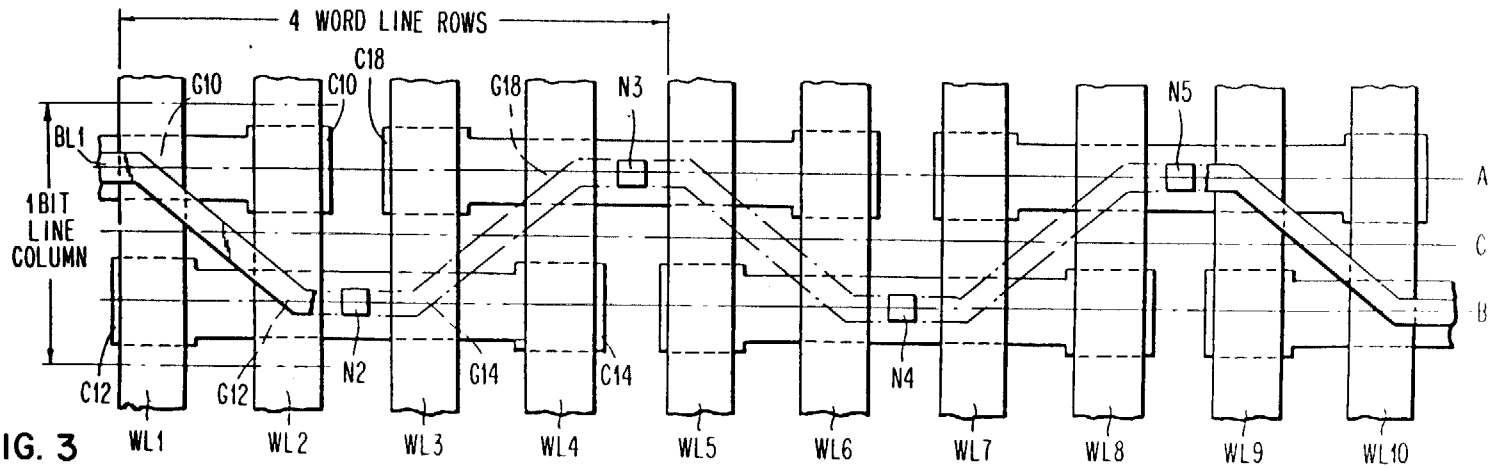
FIG. 3 is a schematic top view of a memory array in accordance with the present invention.

Refer now to FIG. 3 which is a schematic representation of a portion of a memory array fabricated in accordance with the present invention. It is a top view similar to that illustrated in FIG. 2 and line widths (a product of photolithographic limitations) have been kept substantially similar to illustrate the present improvement. Also, corresponding references have been used to permit a correlation with FIGS. 1 and 2, insofar as practical. Comparing FIG. 3 with FIG. 2, it becomes immediately apparent that the amount of space required for four word lines in FIG. 3 is about half the space required in FIG. 2. Thus, for a given bit line length, twice as many memory cells can be accommodated. Alternatively, the same number of memory cells can be accommodated on a bit line only half as long. With a bit line that is only half as long, the same transfer ratio can be maintained with smaller storage capacitors which further reduces the space requirements for any memory cell. These effects are cumulative and significant.

Although the space required by one bit line is greater in FIG. 3 than FIG. 2, the FIG. 3 bit line width more closely approximates the pitch required for the sense amplifier and therefore avoids the problem of added space between adjacent bit lines. The word lines of FIG. 3 are spaced substantially equidistant from each other rather than in spaced apart pairs as was the case in FIG. 2. Note that the column arrangement of memory cells is interdigitated and arranged along first and second parallel lines A and B. In order to sequentially contact the bit line contact region associated with each of doped regions, N2, N3, N4, and N5, the bit line effectively extends to the left and right sides of its center line C in a zig-zag fashion to alternately contact bit line contact regions on opposite sides of its center line.

Thus, from left to right, the bit line starts over word line 1 (which in turn covers gate region G10), passes over word line 2 (which in turn passes over gate region G12) and contacts doped region N2. From there it proceeds back across its center line over word lines 3 and 4 to contact doped region N3. From thence it proceeds to doped region N4 over and across word lines 5 and 6. From thence it proceeds to doped region N5 over and across word line 7 and word line 8.

Word line 1, from top to bottom, passes between gate G10 and bit line 1 and then over capacitor C12. Word line 2, also from top to bottom, passes over capacitor C10 and then between bit line 1 and gate G12. Word line 3 passes over capacitor C18 and then between bit line 1 and gate G14. Word line 4 passes over gate G18, but under bit line 1 and then over storage capacitor C14. Note that each word line alternately passes over a storage region of a first one of the memory cells and next electrically contacts (is electrically integral with) the gate region of a second one of the memory cells. In the case of word line 3, it first passes over storage region C18 of a first memory cell including C18 and T18 and next electrically contacts gate region G14 of a second memory cell formed by transistor T14 and capacitor C14. This structural arrangement contributes to the density of the ultimate memory array.

BEST MODE FOR CARRYING OUT THE INVENTION

Figure 4:
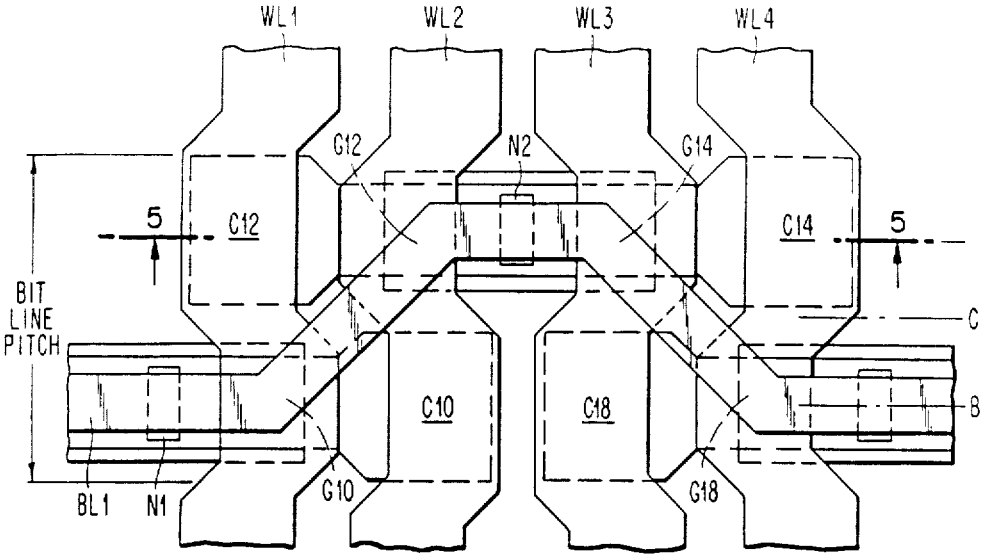
FIG. 4 is a more detailed schematic top view of a portion of a memory array in accordance with the present invention.
Figure 5:
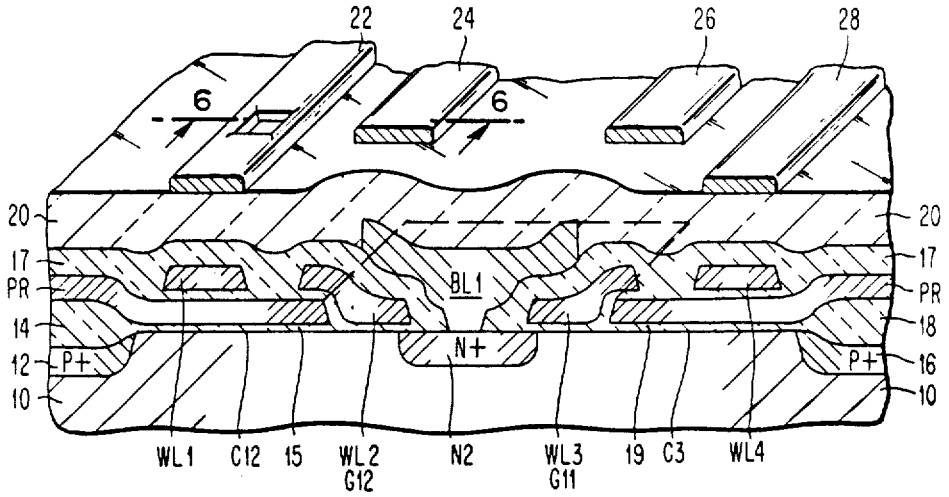
FIG. 5 is a schematic cross-section of a portion of a memory array in accordance with the present invention.

Although a number of arrangements will provide the function desired to be performed by the memory array of the invention, a preferred mode is illustrated in FIG. 4 (top view) and FIG. 5 (cross-sectional view). Again, corresponding references have been utilized insofar as practical. As shown in FIG. 4, word line 1 passes over storage capacitor C12 and then contacts FET gate G10. Word line 2 contacts FET gate G12 and then passes over storage capacitor C10. Word line 3 contacts gate G14 and then passes over storage capacitor C18. Word line 4 passes over storage capacitor C14 and then contacts gate G18. Bit line 1 contacts doped region N1 then passes over word line 1 as well as word line 2 and contacts doped region N2. The bit line then crosses over word lines 3 and 4 in order to contact doped region N3. Thus, memory cells associated with FET T10, capacitor C10 and FET T18 and capacitor C18 are arranged along parallel line B. Memory cells including FET T12, capacitor C12, FET T14, and capacitor C14 are arranged parallel line A (not specifically identified but coextensive with sectional line 5—5).

The zig-zag fashion in which bit line 1 is shown traversing its center line C from left to right is not the only bit line pattern permitting the advantageous features of this invention. For example, a bit line coming down center line C with tab portions extending to the right and left to cover the doped regions N1, N2, N3 would perform the identical function. All that is required is that portions of the bit line alternately contact bit line contact regions of memory cells along both parallel lines A and B. In other words, as long as the bit line has portions extending to electrically contact memory cells arranged along the first and second parallel lines A and B, the advantageous features of the invention are obtained. With present technology a very wide bit line having left and right edges in parallel with each other would be so wide as to create unnecessary bit line capacitance. Such a structure, however, would also be within the spirit and scope of this invention.

The invention will become even clearer with reference to FIG. 5 which is a schematic cross-section along section line 5 in FIG. 4. The presently preferred technology is a double polysilicon (DPS) self-aligned gate process. A substrate 10 is first masked for example with silicon nitride and/or other materials (not shown) in the area between recessed oxide regions 14 and 18. Typically, a composite layer of thin $SiO_2$, covered by $Si_3N_4$, further covered by deposited $SiO_2$ is used. A P type ion implant 12 and 16 is driven deeper into the substrate during the formation of recessed oxide regions 14 and 18 by a well-known snow plow effect. It is to be noted that in addition to the pair of illustrated memory cells in FIG. 5, the rest of the array and support circuits are simultaneously formed by this fabrication process.

Next, the plate region (PR) is formed from polycrystalline silicon (polysilicon) over thin oxide regions 15 and 19 where a capacitor C12 and C14 is desired and over recessed field oxide 14 and 18 where the plate region is intended not to have an effect. A significant aspect of the present arrangement is that the plate region is formed everywhere except in the area of the bit line contact region. This is a result of eliminating wasted space in the array. Of course, the plate region does not have to be a continuous plane in order to practice the broader aspects of this invention.

Subsequently, after the formation of a suitable insulator 17 (such as silicon dioxide) over plate region PR, a second polysilicon layer forms the word lines WL1, WL2, WL3, and WL4 also selectively delineated by well known photolithographic processes. At this point, doped region N2 is formed by introducing N type impurities either by diffusion or ion implantation into the substrate 10. This doped region is self-aligned between WL2 and WL3, as shown. In the illustrated cross-section, WL2 and WL3 form gates G12 and G14 respectively separated by a thin oxide from the P type channel region directly thereunder. Transistors T12 and T14 share the single doped region N2 and no further diffusions or ion implants are required. A fixed bias to the plate region PR in the order of 8.5 volts attracts N type carriers under the plate region simultaneously resulting in the second gated electrode of the field effect transistor and the second plate of the capacitor electrically in common therewith. It should also be pointed out that although no additional diffusions or ion implants are required, it is known to provide threshold tailoring implants and also to provide one device memory cells in which both the source and drain region of the field effect transistor are formed by specifically doped regions. It is also known to have gate oxide of a first thickness under the plate regions PR and a different thickness under the word line gate electrodes, although this feature is not relevant to the present invention.

After the formation of the doped region N2, and formation of a suitable insulator such as silicon dioxide 17 over word line regions and diffused regions, contact holes are opened to the doped region N2, then the metal such as aluminum is deposited to form bit line 1. (The same reference numeral 17 has been used to designate all the contiguous insulating material around the word lines; although it is clear from the foregoing that it is not all formed at the same time.) Bit line 1 then contacts doped region N2 forming a bit line contact region. Various metallurgy techniques are known for providing an ohmic contact between a metallic line and an N+ doped region such that the actual details of the metallurgy need not be described in greater detail.

In the aforementioned description of the preferred embodiments, it has been pointed out that the word lines are formed from highly doped polysilicon. The sheet resistance of highly doped polysilicon, however, is higher than desired. This not only degrades word line rise time but also, more importantly, limits the effectiveness of word line bounce suppression circuits used to clamp down the unselected word lines, thus resulting in poor word line noise immunity. A solution to this problem is the use of a second level metal insulated from and passing over the bit line while running parallel to the word line and periodically making contact thereto. For example, by having the second level metal contact the underlying polysilicon word line every sixty-four cells, the word line time constant is reduced from one hundred-thirty nano-seconds (ns) to two nano-seconds. This second level aluminum separated by an added insulating layer 20 is also shown in FIG. 5. Thus, conductor 22 overlies WL1, conductor 24 overlies WL2, conductor 26 overlies WL3, and conductor 28 overlies WL4. Alternatively, it is known to make the word line from other substances such as polysilicide, for example, which would have a much lower sheet resistance and obviate the need for the periodically contacting second level metal.

Figure 6:
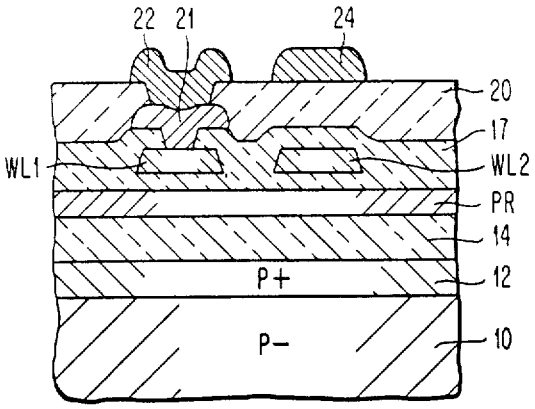
FIG. 6 is a cross-section along section line 6 in FIG. 5.

The interconnection of the aluminum conductors to the word lines is illustrated in FIG. 6, which is a section along line 6 in FIG. 5. Corresponding references identify corresponding elements. Specifically illustrated is conductor 22 making electrical contact with WL1; the metallurgy interconnect region 22' resulting from the particular process. Conductor 24 is shown passing over, but not contacting WL2 at this particular point in the structure.

The operation of memory arrays having memory cells of the type described herein is well known in the art. The plate region PR of the capacitor is usually held to a fixed potential, such as the 8.5 volts mentioned herein above. The selected word line has its potential brought to an up level, such as from 0.0 volts to 8.5 volts. This, in effect, turns on all the FETs along the word line electrically connecting the capacitors to the bit lines. In the case of reading from the memory cells, the voltage level in selected bit lines is sensed and then the information must be written back into all the cells along the word line. This is known as destructive read out. During a write cycle, instead of sensing the voltage level in the bit lines, bit lines are brought to an up or down logic level to charge the capacitor to a binary 0 or a binary 1 level. The cell is now charged with the correct binary information, ready to be sensed again. Those skilled in the art also know that this charge information tends to decay and must be periodically refreshed, thus the term: "AC stable".

Figure 7:
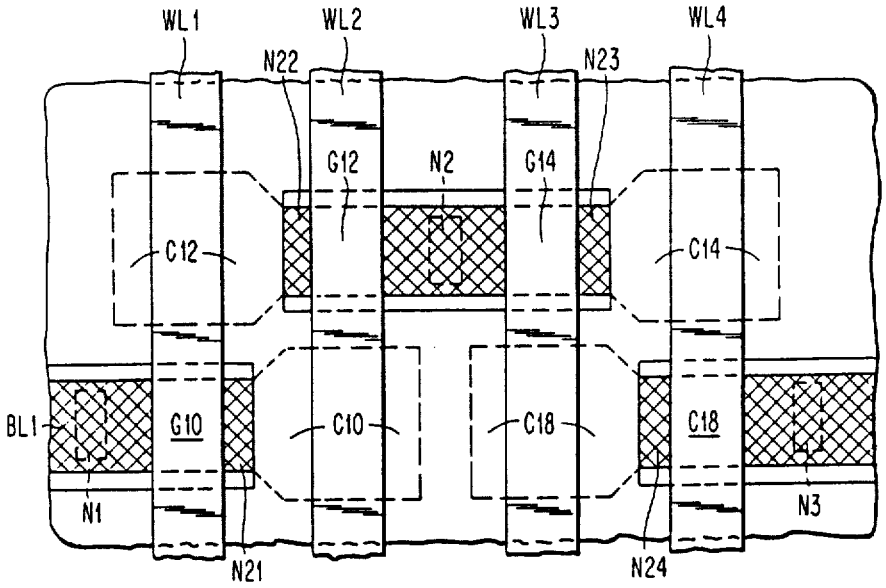
FIG. 7 is an alternate embodiment.

Those skilled in the art will recognize that the present invention is not limited to the described embodiment. For example, refer to FIG. 7 which is a modification of the FIG. 4 arrangement. Corresponding elements have been correspondingly referenced insofar as practical. The only modification is the addition of N type doped regions N21, N22, N23 and N24. These regions are formed simultaneously with the other N type doped regions masked by the polysilicon word lines and the polysilicon region PR. This added diffusion merely creates a conventional FET having both source and drain regions. It is also known, by various other processes, to extend these added doped regions N21, N22, N23, and N24 (ion implanted or diffused) under the plate of the adjacent storate capacitor thereby eliminating the need for a positive bias on plate region PR in order to attract N type impurities.

A further density improvement in the memory array of this invention is provided by a "borderless" contact. As previously mentioned, each memory cell is contacted by a bit line at its doped region (drain/source), such as doped region N2 (FIG. 5). Although the preferred bit line material contains aluminum (a P type impurity in silicon), other materials also require the alignment of the contact within the doped region to prevent electrical contact with the P type silicon. For this reason, the doped region must be made sufficiently large to form a "border" around the contact area, with the contact safely spaced from adjacent P type silicon. However, a "borderless" contact can be made by introducing a second N type impurity, such as phosphorus, into the contact hole opening in the doped region, causing the doped N type region to extend laterally, e.g. under the adjacent field oxide. Thus, the alignment of the contact area becomes less critical and the doped region can be made smaller because no border is required. This space saving, of course is in addition to that provided by two adjacent cells utilizing the same bit line contact.

While we have illustrated and described the preferred embodiment of our invention it is to be understood that we do not limit ourselves to the precise construction herein disclosed and the right is reserved to all changes and modifications coming within the scope of the invention as defined in the appended claims.

What is claimed is:

1. An integrated circuit electronic memory array having a plurality of memory cells, each memory cell of said array having a gate region for controlling the transfer of binary information in and out of a corresponding storage region, and a bit line contact region, said array comprising:

a plurality of word lines arranged in rows each of said word lines alternately passing over the storage region of a first one of said memory cells and being electrically integral with the gate region of a second one of said memory cells; and a plurality of bit lines arranged in columns substantially orthogonal to said word lines, memory cells being arranged along first and second parallel lines in each one of said columns;

each of said plurality of bit lines having portions extending to electrically contact memory cells arranged along said first and second parallel lines, respectively[.], *wherein each said bit line contact region is a common bit line contact region for a pair of adjacent memory cells along said plurality of bit lines.*

[2. An integrated circuit electronic memory array as in claim 1 wherein each said bit line contact region is a common bit line contact region for a pair of adjacent memory cells along said plurality of bit lines.]

3. An integrated circuit electronic memory array as in claim 1 wherein at least one of said plurality of word lines is spaced substantially the same distance from each of its adjacent word lines.

4. An integrated circuit electronic memory array as in claim 1 wherein each said plurality of bit lines is formed substantially passing over each said plurality of word lines.

5. An integrated circuit electronic memory array as in claim 4 wherein each said plurality of word lines is formed from a conductive material selected from the group consisting of polysilicon and polysilicide material, and each said plurality of bit lines is formed from a metal.

6. An integrated circuit electronic memory array as in claim 4 wherein each said plurality of word lines and bit lines is formed from a conductive material selected from the group consisting of polysilicon and polysilicide material.

7. An integrated circuit electronic memory array as in claim 1 wherein said plurality of memory cells and associated support circuits are formed on a semiconductor substrate doped with impurities of a first conductivity type and comprising:

a doped region of a second conductivity type introduced into said substrate and forming a PN junction therewith, one of said plurality of bit lines contacting said doped region and forming said bit line contact region therewith;

a channel region in said substrate adjacent said doped region and underlying the gate region electrically integral with one of said plurality of word lines;

a capacitor region in said substrate adjacent said channel region and underlying a plate region, forming said corresponding storage region; and an isolation region formed into said substrate adjacent said capacitor region.

8. An integrated circuit electronic memory array as in claim 7 wherein said doped region is shared with an adjacent memory cell also having a capacitor region, a channel region, and an isolation region.

9. An integrated circuit electronic memory array as in claim 8 further comprising:

an additional doped region of a second conductivity type also introduced into said substrate and forming a PN junction therewith, and positioned between said channel region and said capacitor region.

10. An integrated circuit electronic memory array as in claim 7 wherein said first conductivity type is formed by P type impurities and said second conductivity type is formed by N type impurities.

11. An integrated circuit electronic memory array as in claim 7 wherein said word line is formed from a polysilicon material.

12. An integrated circuit electronic memory array as in claim 7 wherein said word line is formed from a polysilicide material.

13. An integrated circuit electronic memory array as in claim 7 wherein said word lines are positioned entirely above the substrate surface and said bit lines are positioned substantially passing over said word lines.

14. An integrated circuit electronic memory array as in claim 13 wherein said bit lines are formed from a metal.

15. An integrated circuit electronic memory array as in claim 7 further comprising:

an additional doped region of a second conductivity type also introduced into said substrate and forming a PN junction therewith, and positioned between said channel region and said capacitor region.

16. An integrated circuit electronic memory array having a plurality of memory cells, each memory cell of said array having a gate region for controlling the transfer of binary information in and out of a corresponding storage region, and a bit line contact region, said array comprising:

a plurality of word lines arranged in rows, each said word lines alternately passing over the storage region of a first one of said memory cells and being electrically integral with the gate region of a second one of said memory cells; and a plurality of bit lines arranged in columns substantially along parallel center lines orthogonal to said word lines, each said plurality of bit lines alternately contacting a bit line contact region on opposite sides of its center line[.], *wherein each said bit line contact region is a common bit line contact region for a pair of adjacent memory cells along said plurality of bit lines.*

[17. An integrated circuit electronic memory array as in claim 16 wherein each said bit line contact region is a common bit line contact region for a pair of adjacent memory cells along said plurality of bit lines.]

18. An integrated circuit electronic memory array as in claim 16 wherein at least one of said plurality of word lines is spaced substantially the same distance from each of its adjacent word lines.

19. An integrated circuit electronic memory array as in claim 16 wherein each said plurality of bit lines is formed substantially passing over each said plurality of word lines.

20. An integrated circuit electronic memory array as in claim 16 wherein each said plurality of word lines is formed from a conductive material selected from the group consisting of polysilicon and polysilicide material, and each said plurality of bit lines is formed from a metal.

21. An integrated circuit electronic memory array as in claim 16 wherein each said plurality of word lines is formed from a conductive material selected from the group consisting of polysilicon and polysilicide material.

22. An integrated circuit electronic memory array as in claim 16 wherein said plurality of memory cells and associated support circuits are formed on a semiconductor substrate doped with impurities of a first conductivity type and comprising:

a doped region of a second conductivity type introduced into said substrate and forming a PN junction therewith, one of said plurality of bit lines contacting said doped region and forming said bit line contact region therewith;

a channel region in said substrate adjacent said doped region and underlying the gate region electrically integral with one of said plurality of word lines;

a capacitor region in said substrate adjacent said channel region and underlying a plate region, forming said corresponding storage region; and an isolation region formed into said substrate adjacent said capacitor region.

23. An integrated circuit electronic memory array as in claim 22 wherein said doped region is shared with an adjacent memory cell also having a capacitor region, a channel region, and an isolation region.

24. An integrated circuit electronic memory array as in claim 22 wherein said first conductivity type is formed by P type impurities and said second conductivity type is formed by N type impurities.

25. An integrated circuit electronic memory array as in claim 22 wherein said word line is formed from a polysilicon material.

26. An integrated circuit electronic memory array as in claim 22 wherein said word line is formed from a polysilicide material.

27. An integrated circuit electronic memory array as in claim 22 wherein said word lines are positioned entirely above the substrate surface and said bit lines are positioned substantially passing over said word lines.

28. An integrated circuit electronic memory array as in claim 27 wherein said bit lines are formed from a metal.

29. An integrated circuit electronic memory array as in claims 1 or 16, further comprising:

a plurality of conducting lines disposed over corresponding ones of said plurality of word lines respectively and making periodic electrical contact with said plurality of word lines, thereby reducing the effective electrical resistance of each said plurality of word lines.

*30. An integrated circuit electronic memory array as in claim 1 wherein each said bit line has sides which change direction at spaced intervals along the length of the line.*

*31. An integrated circuit electronic memory array as in claim 1 wherein said gate region and said storage region of each said pair of cells lie in that sequence from said bit line contact region along the same one of said first and second parallel lines.*

* * * * *